United States Patent
Huang et al.

(10) Patent No.: US 8,314,020 B2
(45) Date of Patent: Nov. 20, 2012

(54) METHOD FOR PATTERNING A METAL LAYER AND METHOD FOR MANUFACTURING SEMICONDUCTOR DEVICES BY USING THE SAME

(75) Inventors: Sung-Hui Huang, Taipei County (TW); Wei-Chou Lan, Hsinchu (TW); Chia-Chun Yeh, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 78 days.

(21) Appl. No.: 13/024,335

(22) Filed: Feb. 10, 2011

(65) Prior Publication Data
US 2012/0135588 A1 May 31, 2012

(30) Foreign Application Priority Data

Nov. 29, 2010 (TW) ................................ 99141227 A

(51) Int. Cl.
*H01L 21/336* (2006.01)
(52) U.S. Cl. ................. 438/585; 257/E21.409
(58) Field of Classification Search .................. None
See application file for complete search history.

(56) References Cited

U.S. PATENT DOCUMENTS

| 5,756,372 | A | * | 5/1998 | Wakui et al. ............... 438/30 |
| 2008/0105870 | A1 | * | 5/2008 | Yu et al. ..................... 257/49 |
| 2008/0142894 | A1 | * | 6/2008 | Vereecken et al. ......... 257/368 |

* cited by examiner

*Primary Examiner* — Seahvosh Nikmanesh
(74) *Attorney, Agent, or Firm* — CKC & Partners Co., Ltd.

(57) ABSTRACT

Disclosed herein is a method for patterning a metal layer, which includes the following steps. A substrate having a metal layer thereon is provided. A patterned conductive polymeric layer is formed on the metal layer, wherein a portion of the metal layer is exposed by the patterned conductive polymeric layer. The substrate having the patterned conductive polymer layer is disposed in an electrolytic cell, so that the exposed portion of the metal layer is immersed in the electrolytic solution of the electrolytic cell. The anode of the electrolytic cell is electrically coupled to the patterned conductive polymeric layer, while the cathode of the electrolytic cell is immersed in the electrolytic solution. Sequentially, an electrical potential is applied across the anode and the cathode to perform an electrolysis reaction so that the exposed portion of the metal layer is dissolved in the electrolytic solution.

10 Claims, 6 Drawing Sheets

METHOD FOR PATTERNING A METAL LAYER AND METHOD FOR MANUFACTURING SEMICONDUCTOR DEVICES BY USING THE SAME

RELATED APPLICATIONS

This application claims priority to Taiwan Application Serial Number 099141227, filed Nov. 29, 2010, which is herein incorporated by reference.

BACKGROUND

1. Field of Invention

The present invention relates to a method for patterning a metal layer. More particularly, the present invention relates to a method for patterning a metal layer that is formed on a metal oxide layer.

2. Description of Related Art

Etching processes have been widely used in manufacturing semiconductor device, microelectric mechanic system (MENS), display device and other electronics. Typically, etching process may be classified as two types, dry etching and wet etching. The manufacturer may choose dry etching process or wet etching process depending on the material and the critical dimension.

In wet etching processes, a material is dissolved in the etchant solution by chemical reactions. Therefore, wet etching is advantageous in low cost. However, the wet etching process is isotropic, and is difficult to be applied in fabricating a feature with a high aspect ratio. In addition, the layer, which is desirably etched, must have a different chemical property from adjacent layers to prevent the etchant from damaging the adjacent layers.

In dry etching, ions or particles bombardment are employed. Conventional dry etching processes include plasma etching and reaction ion etching. Dry etching processes may be applied in a feature with a high aspect ratio, and therefore is widely used in semiconductor industrial. For example, through holes in dielectric layers are often fabricated by dry etching processes. However, an etching stop layer is required in dry etching process in order to obtain a better etching profile and uniformity.

In some cases, typical etching processes may not be successfully used. For example, when a metal layer is directly formed on a metal oxide semiconductor layer, conventional etching processes may not successfully be used to etch the metal layer because etchant would damage the metal oxide semiconductor layer. In particular, the metal oxide semiconductor layer has a similar property with the metal layer. When a conventional etching process is employed to etch the metal layer, the metal oxide semiconductor layer would be damaged at the etching endpoint. Therefore, the final semiconductor device has a poor performance.

In view of the above, there exits in this art a need of improved method that is free of the aforementioned problems.

SUMMARY

According to one aspect of the present disclosure, a method for patterning a metal layer is provided. The method comprises the following steps. A substrate having a metal layer thereon is provided. A patterned conductive polymeric layer is formed on the metal layer, wherein a portion of the metal layer is exposed by the patterned conductive polymeric layer. The substrate formed with the patterned conductive polymeric layer is subjected to an electrolytic cell, such that the exposed portion of the metal layer is immersed in an electrolytic solution of the electrolytic cell. An anode of the electrolytic cell is electrically coupled to the patterned conductive polymeric layer, and a cathode of the electrolytic cell is immersed in the electrolytic solution. An electrical potential is applied across the anode and the cathode to perform an oxidation-reduction reaction such that the exposed portion of the metal layer is dissolved in the electrolytic solution.

According to one embodiment of the present disclosure, the method optionally comprises a step of removing the patterned conductive polymeric layer from the substrate after the step of applying the electrical potential.

According to one embodiment of the present disclosure, the metal layer comprises molybdenum, chromium, nickel, aluminum, neodymium or a combination thereof.

According to one embodiment of the present disclosure, the step of forming the patterned conductive polymeric layer comprises forming a photosensitive conductive polymeric layer on the metal layer; and exposing and developing the photosensitive conductive polymeric layer to form the patterned conductive polymeric layer.

According to one embodiment of the present disclosure, the step of forming the patterned conductive polymeric layer comprises a screen-printing process.

According to one embodiment of the present disclosure, the electrolytic solution comprises at least one of sulfuric acid, hydrochloric acid, phosphoric acid and hydrofluoric acid.

According to one embodiment of the present disclosure, the electrical potential is about 5 volts to about 30 volts.

According to another aspect of the present disclosure, a method for patterning a metal layer that is formed on a metal oxide layer is provided. The method comprises the following steps. A substrate having the metal oxide layer thereon is provided. A metal layer is formed to cover the metal oxide layer. A patterned conductive polymeric layer is formed on the metal layer, wherein a portion of the metal layer is exposed by the patterned conductive polymeric layer. The substrate formed with the patterned conductive polymeric layer is subjected to an electrolytic cell, such that the exposed portion of the metal layer is immersed in an electrolytic solution of the electrolytic cell. An anode of the electrolytic cell is electrically coupled to the patterned conductive polymeric layer, and a cathode of the electrolytic cell is immersed in the electrolytic solution. An electrical potential is applied across the anode and the cathode to perform an oxidation-reduction reaction such that the exposed portion of the metal layer is dissolved in the electrolytic solution, and thus allowing the metal oxide layer to be exposed.

According to one embodiment of the present disclosure, the metal oxide layer comprises indium oxide, gallium oxide, zinc oxide, indium gallium oxide, zinc gallium oxide, indium tin oxide or a combination thereof.

According to still another aspect of the present disclosure, a method for fabricating a semiconductor device is provided. The method comprises the following steps. A gate electrode is formed on a substrate. A gate dielectric layer is formed on the gate electrode and the substrate. A patterned metal oxide layer is formed on the gate dielectric layer, wherein the patterned metal oxide layer overlaps the gate electrode. A metal layer is formed on the patterned metal oxide layer and the gate dielectric layer. A patterned conductive polymeric layer is formed on the metal layer, wherein a portion of the metal layer is exposed by the patterned conductive polymeric layer, and the exposed portion of the metal layer overlaps the patterned metal oxide layer. The substrate formed with the patterned conductive polymeric layer is subjected to an electrolytic cell, such that the exposed portion of the metal layer is immersed in an electrolytic solution of the electrolytic cell. An anode of the electrolytic cell is electrically coupled to the patterned conductive polymeric layer, and a cathode of the electrolytic cell is immersed in the electrolytic solution. An electrical potential is applied across the anode and the cathode to perform an oxidation-reduction reaction such that the exposed portion of the metal layer is dissolved in the electrolytic solution, and thus allowing the metal oxide layer to be exposed.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
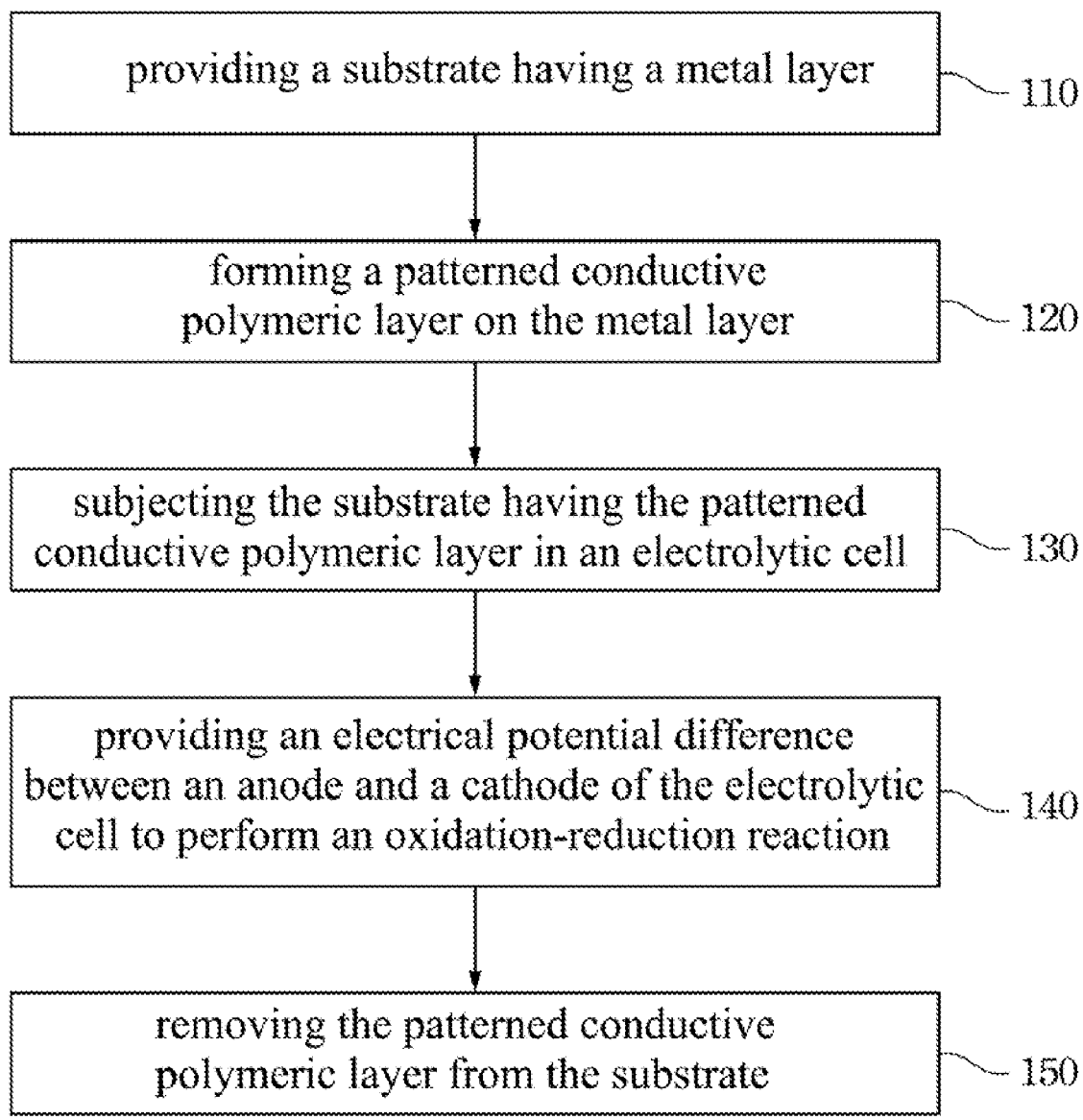
FIG. 1 is a flow chart of a method for patterning a metal layer according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

According to one aspect of the present disclosure, a method for patterning a metal layer is disclosed. FIG. 1 is a flow chart of a method 100 for patterning a metal layer according to one embodiment of the present disclosure. FIG. 2A to FIG. 2E are cross-sectional views schematically illustrating process steps of the method 100.

Figure 2A:
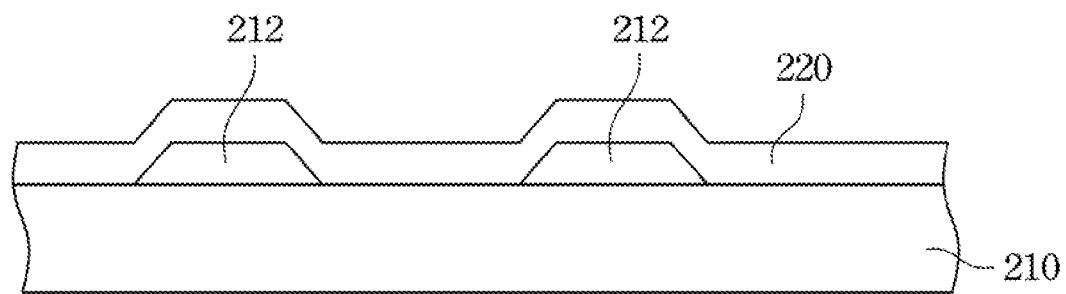
FIG. 2A to FIG. 2E are cross-sectional views schematically illustrating process steps according to one embodiment of the present disclosure.

In step 110, a substrate 210 having a metal layer 220 thereon is provided, as depicted in FIG. 2A. The metal layer 220 may has a multiple layered structure composed of a number of metal layers. In one example, the metal layer 220 may include an aluminum layer and a neodymium layer (Al/Nd). In another example, the metal layer 220 may include two molybdenum layers and an aluminum layer disposed therebetween, and thus forming a sandwich structure (Mo/Al/Mo). The metal layer 220 may be a single layer as well, and is made of a single metal or metal alloy. In one embodiment, the metal layer 220 may comprise molybdenum, chromium, nickel, aluminum, neodymium or a combination thereof. The metal layer 220 may be formed by sputtering, evaporation or other methods of vapor deposition. The thickness of the metal layer 220 is non-limited. For example, the thickness may be about 100 nm to about 1000 nm.

In one embodiment, the substrate 210 comprises a metal oxide semiconductor layer 212. The metal layer 220 covers the metal oxide semiconductor layer 212, as depicted in FIG. 2A. The metal oxide semiconductor layer 212 may be formed on the substrate 210 in advance, and then the metal layer 220 is formed thereon. The metal oxide semiconductor layer 212 may be a patterned layer. The metal oxide semiconductor layer 212 may include indium oxide, gallium oxide, zinc oxide, indium gallium oxide, zinc gallium oxide, indium tin oxide or a combination thereof.

Figure 2B:
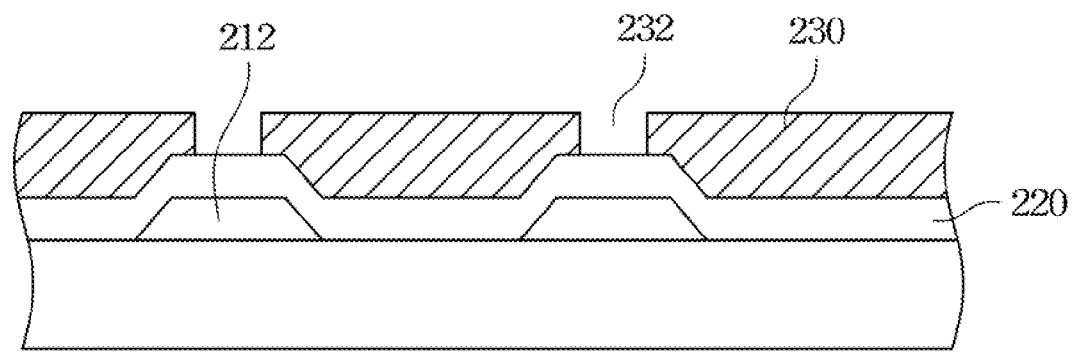

In step 120, a patterned conductive polymeric layer 230 is formed on the metal layer 220, and a portion of the metal layer 220 is exposed by the patterned conductive polymeric layer 230, as depicted in FIG. 2B. Specifically, the patterned conductive polymeric layer 230 has at least one opening 232 to expose a portion of the metal layer 220. The patterned conductive polymeric layer 230 may be made of a conductive polymeric material having a resistance less than or equal to 0.1 Ω·cm. In other words, the patterned conductive polymeric layer 230 has a good conductivity. The conductivity is affected by the thickness of the patterned conductive polymeric layer 230. When the thickness is too thin, the conductivity of the patterned conductive polymeric layer 230 may be too small and is unfavorable to the process that follows. To the contrary, when the thickness is too thick, the process period of time required in the subsequent process may be undesirably prolonged because the rate of mass transportation in the opening 232 decreases due to the depth of the opening 232 increased. Therefore, in one embodiment, the thickness of the patterned conductive polymeric layer 230 is about 0.5 μm to about 3 μm.

The conductive polymer may be a polymer having a conjugated double bond such as polyacetylene, poly(p-phenylene sulfide), poly(p-phenylene), poly(p-phenylene vinylene), polythiophene, poly(thienylene vinylene), poly(3,4-ethylenedioxythiophene), polyaniline, polypyrrole, poly(styrenesulfonate) (PEDOT:PSS) and 3-hexyl-thiophene-3thiophene-ethane-methcylate copolymer. The patterned conductive polymeric layer 230 may comprise conductive particles such as carbon powder, graphite powder and metal particles to increase the conductivity. The conductive particles may exist in a concentration of about 10% to about 80% by weight of the patterned conductive polymeric layer 230. The conductive polymeric material is not limited to the above-mentioned compositions. Other commercial products of conductive polymers may be employed in the present disclosure as well.

In one embodiment, the patterned conductive polymeric layer 230 may be formed by applying a photosensitive material that contains conductive polymer. Particularly, a layer of photosensitive material, which contains conductive polymer, is formed on the metal layer 220. Subsequently, the layer of photosensitive material is exposed, and thus forming an exposed region and an unexposed region. A developing process may be employed to remove the unexposed region of the photosensitive material, and thus forming the opening 232. In other words, the photosensitive material may comprise a negative photoresist. In one example, the photosensitive material may comprise a conductive polymer, solvent and sensitizer. For example, the conductive polymer may comprise 3-hexyl-thiophene-3thiophene-ethane-methcylate copolymer. The solvent may comprise aceto-nitrile solution of gold chloride. The sensitizer may comprise gold chloride.

In another embodiment, the patterned conductive polymeric layer 230 may be formed by a screen-printing method, without employing photolithography. Briefly, a layer of paste containing conductive polymer may be formed on the metal layer 220 by using a screen mask, and followed by a drying process to form the patterned conductive polymeric layer 230.

Figure 2C:
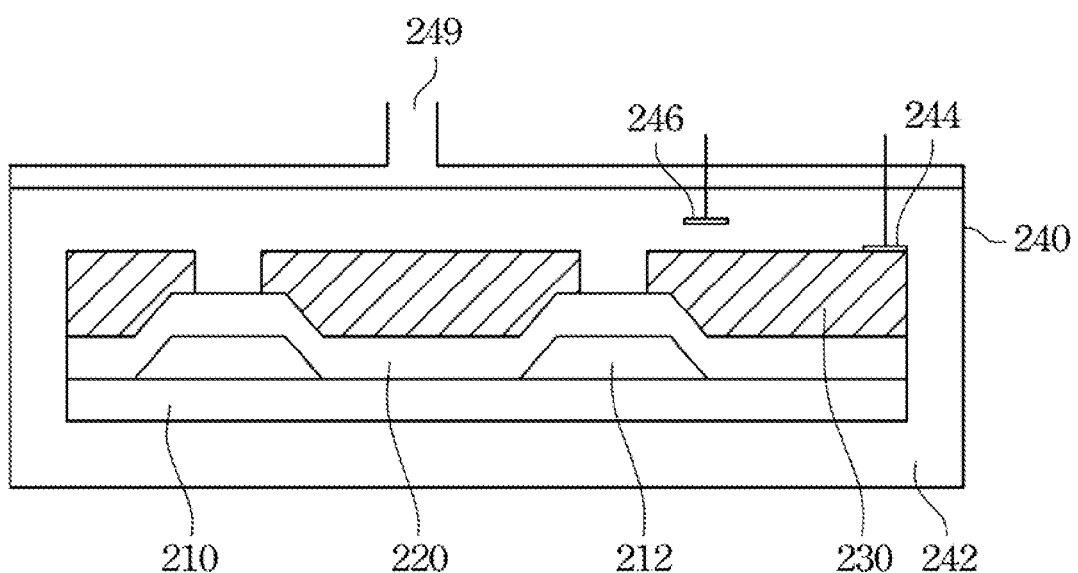

In step 130, the substrate 210 formed thereon with the patterned conductive polymer layer 230 is subjected to an electrolytic cell, as depicted in FIG. 2C. The electrolytic cell 240 includes electrolytic solution 242, an anode 244, and a cathode 246. The anode 244 of the electrolytic cell 240 is electrically coupled to the patterned conductive polymeric layer 230, and the cathode 246 of the electrolytic cell 240 is immersed in the electrolytic solution 242. The electrolytic solution 242 contacts the exposed portion of the metal layer 220, whereas the electrolytic solution 242 may not contact the portion of the metal layer 220 covered by the patterned conductive polymeric layer 230. In examples, the electrolytic solution 242 may comprise acid such as sulfuric acid, hydrochloric acid, phosphoric acid and hydrofluoric acid. Other commercial products of electrolytic solution may be employed in the present disclosure as well.

Figure 2D:
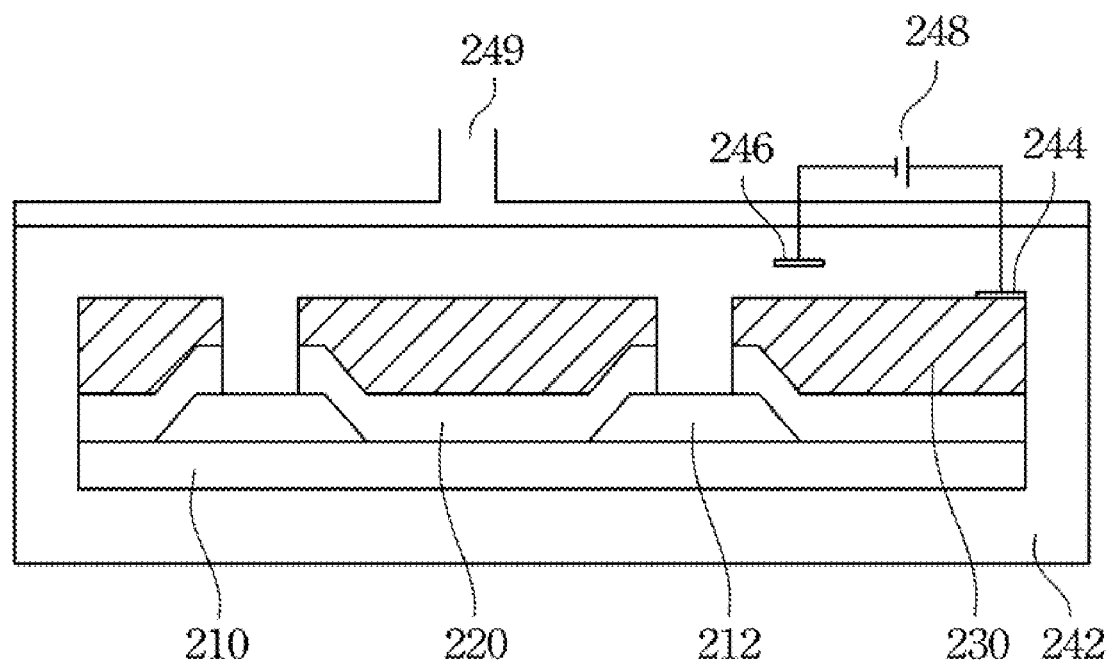

In step 140, an electrical potential 248 is applied across the anode 244 and the cathode 246 to perform an oxidation-reduction reaction such that the exposed portion of the metal layer 220 is dissolved in the electrolytic solution 242, as depicted in FIG. 2D. The anode 244 is electrically coupled to the patterned conductive polymeric layer 230 which contacts the metal layer 220. Therefore, electrical current may be transmitted to the metal layer 220 from the anode 244 through the patterned conductive polymeric layer 230. In the condition of the electrical potential, the exposed portion of the metal layer 220 may carry out an oxidation reaction, and becomes metal ions dissolved in the electrolytic solution 242. Therefore, the exposed portion of the metal layer 220 may be removed. The above-mentioned oxidation reaction may be expressed as Equation (1) below:

$$M \rightarrow M^+ + e^- \qquad \text{Equation (1)}$$

wherein M represents a metal atom; $M^+$ represents a metal ion; and $e^-$ represents an electron.

The unexposed portion of metal layer 220, covered by the patterned conductive polymeric layer 230, may not contact electrolytic solution 242, and therefore would not be oxidized as metal ions. In other words, the exposed portion of the metal layer 220 would be dissolved in the electrolytic solution 242 whereas the unexposed portion of the metal layer 220, covered by the patterned conductive polymeric layer 230, would not carry out electrolysis due to in isolation from the electrolytic solution. Therefore, the metal layer may be patterned, and the pattern of the conductive polymeric layer 230 may be transferred to the metal layer 220.

When the metal layer 220 carries out the oxidation reaction, the cathode 246 simultaneously performs a reduction reaction. The cathode 246 may provide electrons to the electrolytic solution 242 because of contact with the electrolytic solution 242, and thus the cation in the electrolytic solution 242 may be reduced. The reduction reaction may be expressed as Equation (2):

$$2H^+ + 2e^- \rightarrow H_2 \qquad \text{Equation (2)}$$

wherein $H^+$ represents a hydrogen ion; $H_2$ represents a hydrogen molecular; and $e^-$ represents an electron.

Hydrogen gas would be generated at the cathode 246, and therefore the electrolytic cell 240 may include an exhaust 249 for collecting hydrogen gas.

In the step of applying an electrical potential, the electrical potential may be about 1 volt to about 100 volts, depending on the material of the patterned conductive polymeric layer and the material of the metal layer. In general, the electrical potential may be about 5 volts to about 30 volts, for example.

In the embodiment of the substrate 210 comprising the metal oxide semiconductor layer 212, the metal oxide semiconductor layer 212 may be exposed after removing the metal layer 220 located thereon. It is noted that the metal oxide semiconductor layer 212 is non-conductive and would not carry out any electrolysis reaction, even though while it contacts the electrolytic solution 242. Therefore, the metal oxide semiconductor layer 212 would not be destroyed by patterning the metal layer 220 during the step 140 of electrolysis, and may possess a desirable semiconductor property. That is, the electrical performance of the metal oxide semiconductor layer 212 in electronic devices may be kept according to one embodiment of the present disclosure.

In the prior art, wet etching or dry etching is usually employed to pattern a metal layer. However, when a metal oxide layer is disposed beneath the metal layer, the metal oxide layer is often damaged in the process of wet etching because the metal oxide layer usually has a similar chemical property with the metal layer. Particularly, when the material of the metal oxide layer comprises indium oxide, gallium oxide, zinc oxide, indium gallium oxide, zinc gallium oxide, indium tin oxide, the process of wet etching or dry etching known in the art would seriously destroy the original property of the metal oxide layer. As a result, the final electronic devices have a poor electrical performance. Therefore, the drawback that existed in the prior art may be improved according to one embodiment of the present disclosure.

Figure 2E:
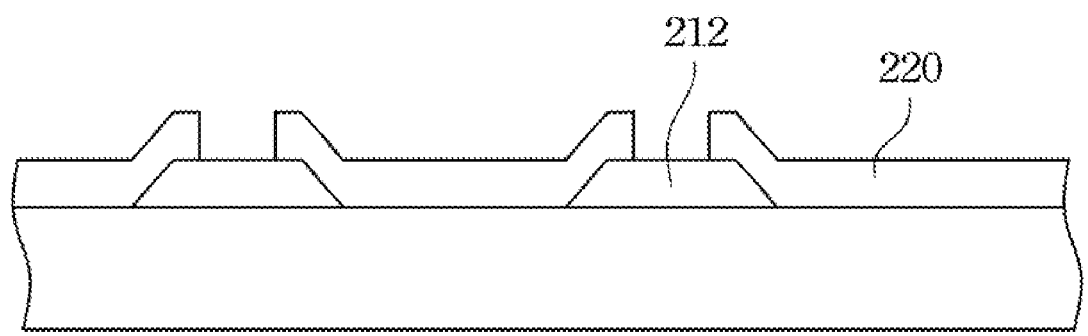

Optionally, step 150 may be carried out after step 140. In step 150, the patterned conductive polymeric layer 230 is removed from the substrate 210, as depicted in FIG. 2E. The patterned conductive polymeric layer 230 may be removed by wet stripping methods or a plasma etching methods, for example. In the wet stripping method, the stripper may be TOK105™ or TOK106™ (TOKYO OHKA KOGYO Co., Ltd, Japan). In the plasma etching method, $O_2$ plasma or $SF_6$ plasma may be employed to remove the conductive polymeric layer 230.

Figure 3:
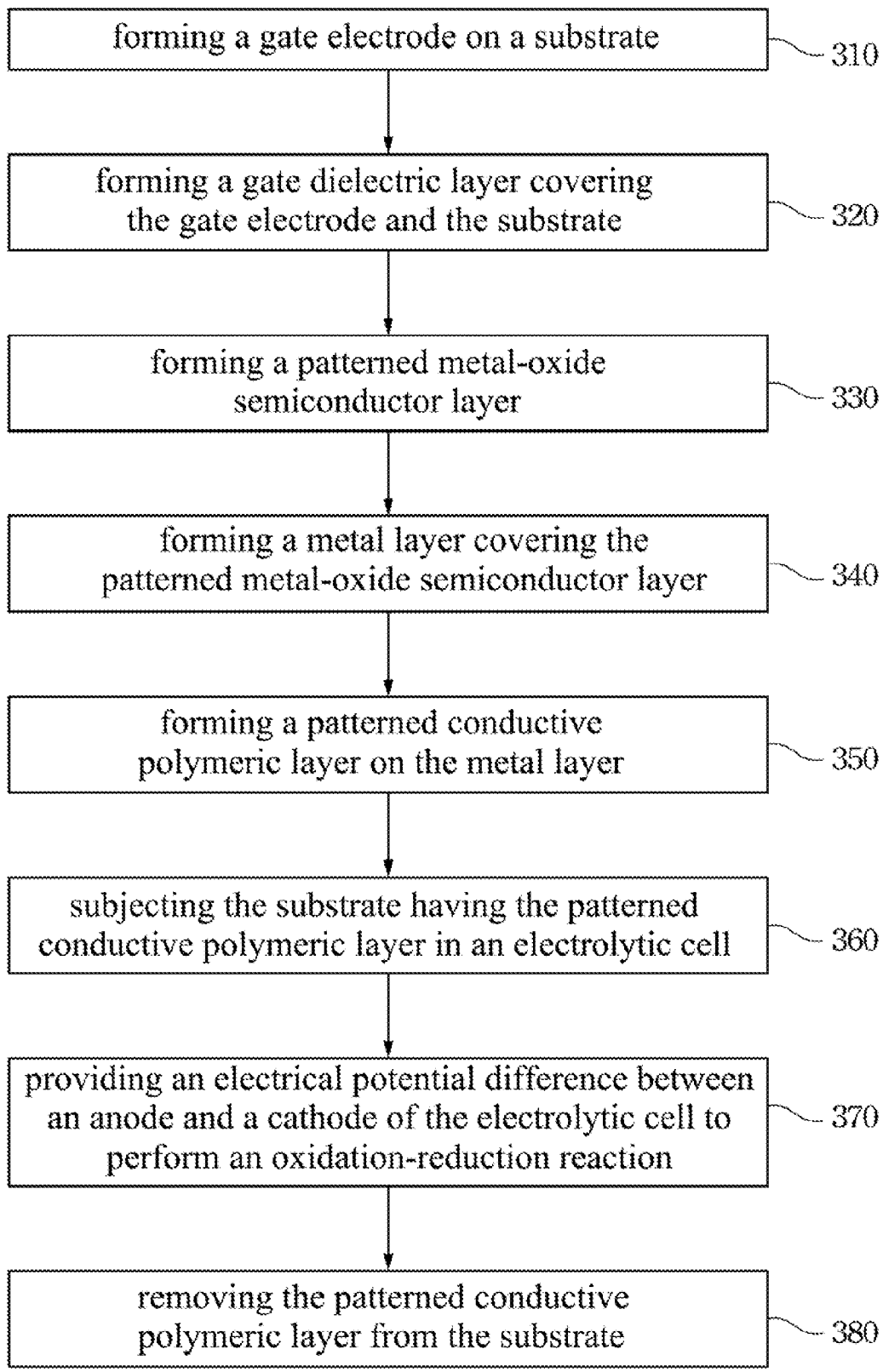
FIG. 3 is a flow chart of a method for fabricating semiconductor devices according to one embodiment of the present disclosure.

According to another aspect of the present disclosure, a method for fabricating semiconductor devices is provided. FIG. 3 is a flow chart of a method 300 for fabricating semiconductor devices according to one embodiment of the present disclosure. FIG. 4A to FIG. 4F are cross-sectional views schematically illustrating process steps of the method 300.

Figure 4A:
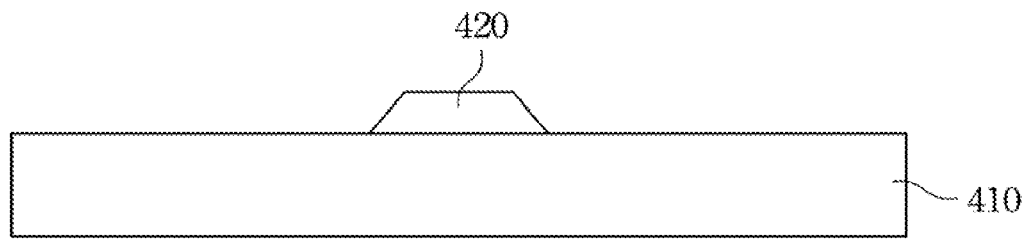
FIG. 4A to FIG. 4F are cross-sectional views schematically illustrating process steps according to one embodiment of the present disclosure.

In step 310, a gate electrode 420 is formed on a substrate 410, as depicted in FIG. 4A. The substrate 410 may be made of glass or other flexible plastics, for example. The gate electrode 420 may be made of aluminum, copper, silver or other metals with desirable conductivity. The gate electrode 420 may be formed by thin film deposition and followed by photolithography, which are known in the art.

Figure 4B:
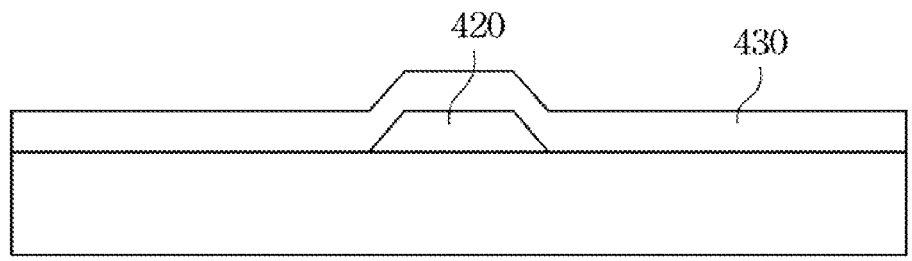

In step 320, a gate dielectric layer 430 is formed to cover the gate electrode 430 and the substrate 410, as depicted in FIG. 4B. The gate dielectric layer 430 may be made of silicon oxide or silicon nitride, for example.

Figure 4C:
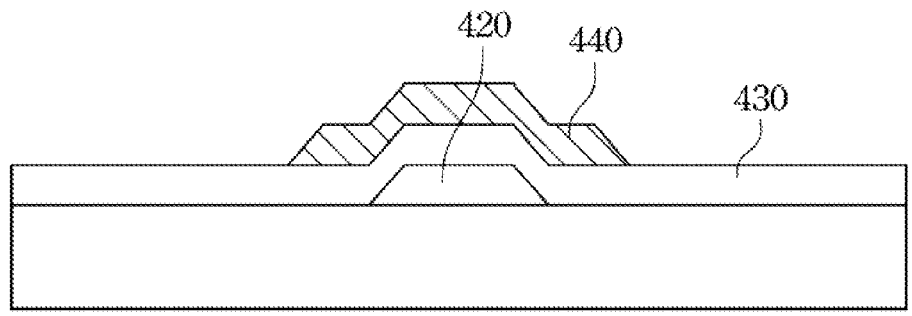

In step 330, a patterned metal oxide layer 440 is formed on the gate dielectric layer 420, as depicted in FIG. 4C. The patterned metal oxide layer 440 has a specific pattern that overlaps the gate electrode 420. The area of the metal oxide layer 440 may be larger or smaller than the gate electrode 420. Suitable materials for the metal oxide layer 440 includes, but are limited to, indium oxide, gallium oxide, zinc oxide, indium gallium oxide, zinc gallium oxide, indium tin oxide or a combination thereof.

Figure 4D:
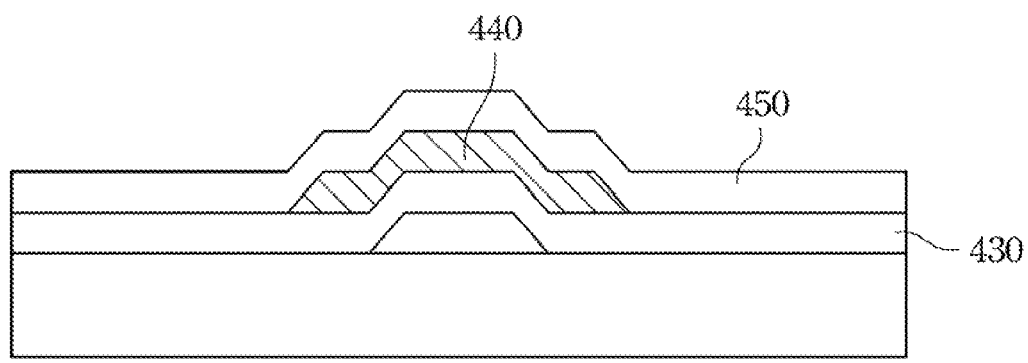

In step 340, a metal layer 450 is formed on the patterned metal oxide layer 440 and the gate dielectric layer 430, as depicted in FIG. 4D. The metal layer 450 may have a multiple layered structure composed of a number of metal layers. In one example, the metal layer 450 may include an aluminum layer and a neodymium layer (Al/Nd). In another example, the metal layer 450 may include two molybdenum layers and an aluminum layer disposed therebetween, and thus forming a sandwich structure (Mo/Al/Mo). The metal layer 450 may be a single layer as well, and may be made of a single metal or metal alloy. In one embodiment, the metal layer 450 may comprise molybdenum, chromium, nickel, aluminum, neodymium or a combination thereof. The metal layer 450 may be formed by sputtering, evaporation or other vapor deposition methods.

Figure 4E:
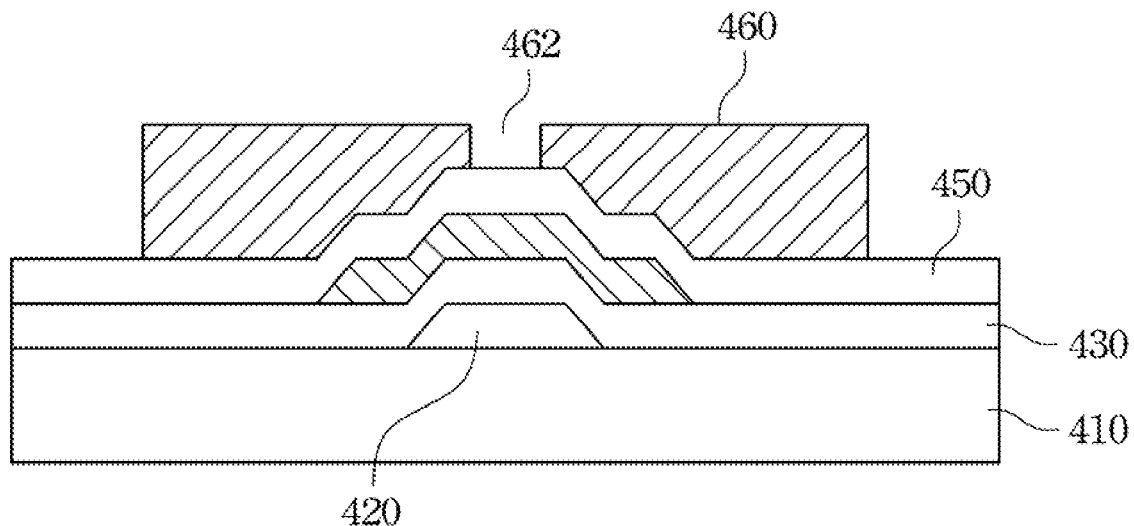

In step 350, a patterned conductive polymeric layer 460 is formed on the metal layer 450, as depicted in FIG. 4E. A portion of the metal layer 450 is exposed by the patterned conductive polymeric layer 460. Specifically, the patterned conductive polymeric layer 460 has an opening 462 that overlaps the metal oxide layer 440, and the metal layer 450 may be revealed through the opening 462. The method of forming the patterned conductive polymeric layer 460 may be similar to those described in step 120 of method 100.

In step 360, the substrate 410 having the patterned conductive polymeric layer 460 is subjected to an electrolytic cell, which is depicted in FIG. 2C. Step 360 is similar to step 130 of method 100 described above. Briefly, the exposed portion of the metal layer 450 is immersed in an electrolytic solution in the electrolytic cell. The anode of the electrolytic cell is electrically coupled to the patterned conductive polymeric layer 460, and the cathode of the electrolytic cell is immersed in the electrolytic solution.

In step 370, an electrical potential is applied across the anode and the cathode to perform an oxidation-reduction reaction such that the exposed portion of the metal layer 450 in the opening 462 is removed. Step 370 is similar to step 140 of method 100 described above. The exposed portion of the metal layer 450 may be dissolved in the electrolytic solution, and therefore the metal oxide layer 440 under the metal layer 450 would be exposed. Particularly, metal layer 450 is patterned in this step, and source/drain electrodes are formed. When the metal layer 450 performs the oxidation reaction, the cathode performs the reduction reaction simultaneously and generates hydrogen gas.

Figure 4F:
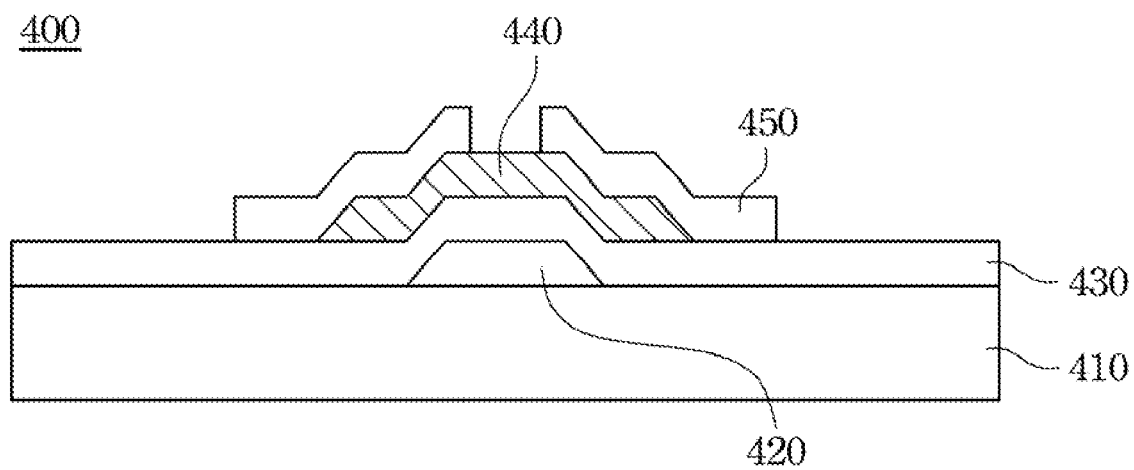

In step 380, the patterned conductive polymeric layer 460 is removed from the substrate 460, and thus forming a semiconductor device 400, as depicted in FIG. 4F. The semiconductor device 400 may be a metal-oxide semiconductor transistor (MOS transistor), for example. Step 380 may be similar to step 150 of method 100 as described above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for patterning a metal layer, comprising:
    providing a substrate having a metal layer thereon;
    forming a patterned conductive polymeric layer on the metal layer, wherein a portion of the metal layer is exposed by the patterned conductive polymeric layer;
    subjecting the substrate formed with the patterned conductive polymeric layer to an electrolytic cell, such that the exposed portion of the metal layer is immersed in an electrolytic solution of the electrolytic cell, wherein an anode of the electrolytic cell is electrically coupled to the patterned conductive polymeric layer, and a cathode of the electrolytic cell is immersed in the electrolytic solution; and
    applying an electrical potential across the anode and the cathode to perform an oxidation-reduction reaction such that the exposed portion of the metal layer is dissolved in the electrolytic solution.

2. The method according to claim 1, further comprising:
    removing the patterned conductive polymeric layer from the substrate after the step of applying the electrical potential.

3. The method according to claim 1, wherein the metal layer comprises molybdenum, chromium, nickel, aluminum, neodymium or a combination thereof.

4. The method according to claim 1, wherein the step of forming the patterned conductive polymeric layer comprises:
    forming a photosensitive conductive polymeric layer on the metal layer; and
    exposing and developing the photosensitive conductive polymeric layer to form the patterned conductive polymeric layer.

5. The method according to claim 1, wherein the step of forming the patterned conductive polymeric layer comprises a screen-printing process.

6. The method according to claim 1, wherein the electrolytic solution comprises at least one of sulfuric acid, hydrochloric acid, phosphoric acid and hydrofluoric acid.

7. The method according to claim 1, wherein the electrical potential is about 5 volts to about 30 volts.

8. A method for patterning a metal layer that is formed on a metal oxide layer, comprising:
    providing a substrate having the metal oxide layer thereon;
    forming a metal layer covering the metal oxide layer;
    forming a patterned conductive polymeric layer on the metal layer, wherein a portion of the metal layer is exposed by the patterned conductive polymeric layer;
    subjecting the substrate formed with the patterned conductive polymeric layer to an electrolytic cell, such that the exposed portion of the metal layer is immersed in an electrolytic solution of the electrolytic cell, wherein an anode of the electrolytic cell is electrically coupled to the patterned conductive polymeric layer, and a cathode of the electrolytic cell is immersed in the electrolytic solution; and
    applying an electrical potential across the anode and the cathode to perform an oxidation-reduction reaction such that the exposed portion of the metal layer is dissolved in the electrolytic solution, and thus allowing the metal oxide layer to be exposed.

9. The method according to claim 8, wherein the metal oxide layer comprises indium oxide, gallium oxide, zinc oxide, indium gallium oxide, zinc gallium oxide, indium tin oxide or a combination thereof.

10. A method for fabricating a semiconductor device, comprising:
    forming a gate electrode on a substrate;
    forming a gate dielectric layer on the gate electrode and the substrate;
    forming a patterned metal oxide layer on the gate dielectric layer, wherein the patterned metal oxide layer overlaps the gate electrode;

forming a metal layer on the patterned metal oxide layer and the gate dielectric layer;

forming a patterned conductive polymeric layer on the metal layer, wherein a portion of the metal layer is exposed by the patterned conductive polymeric layer, and the exposed portion of the metal layer overlaps the patterned metal oxide layer;

subjecting the substrate having the patterned conductive polymeric layer to an electrolytic cell, such that the exposed portion of the metal layer is immersed in an electrolytic solution of the electrolytic cell, wherein an anode of the electrolytic cell is electrically coupled to the patterned conductive polymeric layer, and a cathode of the electrolytic cell is immersed in the electrolytic solution; and applying an electrical potential across the anode and the cathode to perform an oxidation-reduction reaction such that the exposed portion of the metal layer is dissolved in the electrolytic solution, and thus allowing the metal oxide layer to be exposed.

* * * * *